US010325975B2

(12) United States Patent
Moon et al.

(10) Patent No.: US 10,325,975 B2
(45) Date of Patent: Jun. 18, 2019

(54) ORGANIC LIGHT-EMITTING DEVICE AND METHOD FOR PREPARING SAME

(71) Applicant: LG DISPLAY CO., LTD., Seoul (KR)

(72) Inventors: Young Kyun Moon, Daejeon (KR); Minsoo Kang, Daejeon (KR); Jin Bok Lee, Daejeon (KR); Byung Woo Yoo, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/310,699

(22) PCT Filed: May 4, 2015

(86) PCT No.: PCT/KR2015/004480
§ 371 (c)(1),
(2) Date: Nov. 11, 2016

(87) PCT Pub. No.: WO2015/174672
PCT Pub. Date: Nov. 19, 2015

(65) Prior Publication Data
US 2017/0077210 A1 Mar. 16, 2017

(30) Foreign Application Priority Data
May 12, 2014 (KR) .................. 10-2014-0056776

(51) Int. Cl.
*H01L 27/32* (2006.01)
*H01L 51/52* (2006.01)

(52) U.S. Cl.
CPC ...... *H01L 27/3276* (2013.01); *H01L 51/5209* (2013.01); *H01L 51/5212* (2013.01); *H01L 51/5225* (2013.01); *H01L 51/5228* (2013.01); *H01L 2251/5361* (2013.01); *H01L 2251/5392* (2013.01)

(58) Field of Classification Search
CPC ............. H01L 51/5209; H01L 51/5212; H01L 51/5225; H01L 51/5228; H01L 51/5203–5234
See application file for complete search history.

(56) References Cited

U.S. PATENT DOCUMENTS 6,157,127 A * 12/2000 Hosokawa .......... H01L 27/3288
313/506
6,278,136 B1 8/2001 Nitta
6,525,467 B1 * 2/2003 Eida .................... H01L 27/3281
313/504
6,538,391 B1 * 3/2003 Suzuki .................. B82Y 10/00
313/495
2003/0006697 A1 * 1/2003 Weaver ............... H01L 27/3246
313/503

(Continued)

FOREIGN PATENT DOCUMENTS

CN 1447630 A 10/2003
CN 1832225 A 9/2006
(Continued)

OTHER PUBLICATIONS

Machine translation of JP 2001196191 A.*

*Primary Examiner* — Bryan R Junge
(74) *Attorney, Agent, or Firm* — Dentons US LLP

(57) ABSTRACT

The present specification relates to an organic light emitting device and a method for manufacturing the same.

22 Claims, 6 Drawing Sheets

(56) References Cited

U.S. PATENT DOCUMENTS

| | | |
|---|---|---|
| 2003/0222861 A1 | 12/2003 | Nishikawa et al. |
| 2004/0202777 A1 | 10/2004 | Nishikawa et al. |
| 2005/0023969 A1* | 2/2005 | Omata ................ H01L 27/3246 313/504 |
| 2005/0230678 A1* | 10/2005 | Cao .................... H01L 51/5203 257/40 |
| 2006/0202611 A1 | 9/2006 | Hayashi |
| 2010/0283071 A1 | 11/2010 | Li et al. |
| 2011/0128268 A1 | 6/2011 | Kim et al. |
| 2011/0193066 A1 | 8/2011 | Parker et al. |
| 2011/0220957 A1 | 9/2011 | Hartmann et al. |
| 2012/0038847 A1 | 2/2012 | Lin et al. |
| 2012/0153831 A1 | 6/2012 | Kasai |
| 2012/0161166 A1 | 6/2012 | Yamazaki |
| 2013/0187186 A1* | 7/2013 | Popp ................... H01L 51/5203 257/99 |
| 2014/0034920 A1* | 2/2014 | Lee .................... H01L 51/5212 257/40 |
| 2014/0103304 A1 | 4/2014 | Kang et al. |
| 2016/0027862 A1* | 1/2016 | Lee .................... H01L 27/3279 257/40 |
| 2016/0072092 A1* | 3/2016 | Lee .................... H01L 51/5203 257/40 |

FOREIGN PATENT DOCUMENTS

| | | |
|---|---|---|
| CN | 102224615 A | 10/2011 |
| CN | 102548078 A | 7/2012 |
| EP | 1003229 A1 | 5/2000 |
| JP | 2001196191 A * | 7/2001 |
| JP | 2011118341 A | 6/2011 |
| JP | 2013197298 A | 9/2013 |
| JP | 2014053120 A | 3/2014 |
| JP | 2016518018 A | 6/2016 |
| KR | 1020040067964 A | 7/2004 |
| KR | 1020060097595 A | 9/2006 |
| KR | 20110102373 A | 9/2011 |
| KR | 1020140049401 A | 4/2014 |
| TW | 299585 B | 8/2008 |
| TW | 201041430 A | 11/2010 |

* cited by examiner

ORGANIC LIGHT-EMITTING DEVICE AND METHOD FOR PREPARING SAME

TECHNICAL FIELD

This application is a National Stage Application of International Application No. PCT/KR2015/004480, filed on May 4, 2015, and claims the benefit of Korean Patent Application No. 10-2014-0056776, filed on May 12, 2014, the contents of which are incorporated herein by reference in their entirety for all purposes as if fully set forth below.

The present specification relates to an organic light emitting device and a method for manufacturing the same.

BACKGROUND ART

An organic light emission phenomenon refers to a phenomenon converting electrical energy to light energy using an organic material. In other words, when a proper organic material layer is placed between an anode and a cathode and a voltage is applied between the two electrodes, holes and electrons are injected to the organic material layer from the anode and the cathode, respectively. These injected holes and electrons meet to form excitons, and light emits when these excitons fall back to the ground state.

An organic light emitting device is likely to have short defects since space between an anode and a cathode is small. By pin holes, cracks, steps in the structure of an organic light emitting device, coating roughness and the like, an anode and a cathode may be in direct contact with each other, or an organic layer thickness may be made to be thinner in these defect regions. These defect regions provide a low-resistance path that allows a current flow, and make the flow hardly flowing or not flowing at all in extreme cases through an organic light emitting device. As a result, the organic light emitting device has reduced or no light emission output. In multi-pixel display devices, short defects may decline display qualities by producing dead pixels that do not emit light or emit light having intensity less than average light intensity. In illumination or other low-resolution applications, a considerable portion of the corresponding region may not operate due to short defects. With concerns for short defects, manufacture of an organic light emitting device is typically carried out in a clean room. However, no matter how clean the environment is, it cannot be effective in removing short defects. In many cases, the thickness of an organic layer increases more than actually needed to operate a device in order to decrease the number of short defects by increasing a distance between two electrodes. Such a method adds costs in manufacturing an organic light emitting device, and short defects may not even be completely removed using such a method.

PRIOR ART DOCUMENTS

Patent Documents

Korean Patent Application Laid-Open Publication No. 10-2006-0130729 (published on 2006 Dec. 19)

DISCLOSURE

Technical Problem

An object of the present invention is to provide an organic light emitting device in which, even when short defects occur in one region of an organic light emitting device, a region having no short circuit is capable of normal operation, and a method for manufacturing the same.

Technical Solution

One embodiment of the present specification provides an organic light emitting device including a substrate; a first electrode provided on the substrate, and including two or more conductive units provided to be separated from each other and a conductive connection connected to the conductive units; an auxiliary electrode provided on the substrate, and disposed to be separated from the conductive units; an insulation layer provided on the conductive connection or the auxiliary electrode, and including one or more contact holes exposing one region of the conductive connection or the auxiliary electrode; a second electrode provided opposite to the first electrode; and one or more organic material layers provided between the first electrode and the second electrode, wherein the conductive connection is electrically connected to the auxiliary electrode through the contact holes, and the conductive connection includes one or more high resistance regions in which a length of a current flowing direction is longer than a width of a direction vertical thereto.

One embodiment of the present specification provides a method for manufacturing the organic light emitting device including preparing a substrate; forming an auxiliary electrode on the substrate; forming a first electrode including two or more conductive units provided to be separated from each other and a conductive connection connected to the conductive units on the substrate; forming an insulation layer including one or more contact holes on the conductive connection or the auxiliary electrode; forming one or more organic material layers on the first electrode; and forming a second electrode on the organic material layers, wherein the conductive connection is electrically connected to the auxiliary electrode through the contact holes, and the conductive connection includes one or more high resistance regions in which a length of a current flowing direction is longer than a width of a direction vertical thereto.

One embodiment of the present specification provides a display device including the organic light emitting device.

One embodiment of the present specification provides an illumination device including the organic light emitting device.

Advantageous Effects

An organic light emitting device according to one embodiment of the present specification does not lose its function even when a short circuit occurs due to defects of one region of a substrate.

In addition, an organic light emitting device according to one embodiment of the present specification can stably operate without increasing a leakage current quantity even when an area size of a short circuit occurring location increases.

EXPLANATION OF SYMBOLS

101: Substrate
201: Conductive Unit
301: Auxiliary Electrode
401: Insulation Layer
501: Conductive Connection
511: High Resistance Region
601: Contact Holes
701: Additional Insulation Layer
801: Organic Material Layer
901: Second Electrode

MODE FOR DISCLOSURE

Hereinafter, the present specification will be described in more detail.

In the present specification, a description of one member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

One embodiment of the present specification provides an organic light emitting device including a substrate; a first electrode provided on the substrate, and including two or more conductive units provided to be separated from each other and a conductive connection connected to the conductive units; an auxiliary electrode provided on the substrate, and disposed to be separated from the conductive units; an insulation layer provided on the conductive connection or the auxiliary electrode, and including one or more contact holes exposing one region of the conductive connection or the auxiliary electrode; a second electrode provided opposite to the first electrode; and one or more organic material layers provided between the first electrode and the second electrode, wherein the conductive connection is electrically connected to the auxiliary electrode through the contact holes, and the conductive connection includes one or more high resistance regions in which a length of a current flowing direction is longer than a width of a direction vertical thereto.

The provided to be separated from each other means the conductive units being spatially separated from each other. In addition, it means the conductive units not physically adjoining to each other.

The conductive unit of the present specification means a region excluding the conductive connection in the constitution forming the first electrode. Specifically, the conductive units may be a region of the first electrode provided in a light emitting region of the organic light emitting device.

Figure 1:
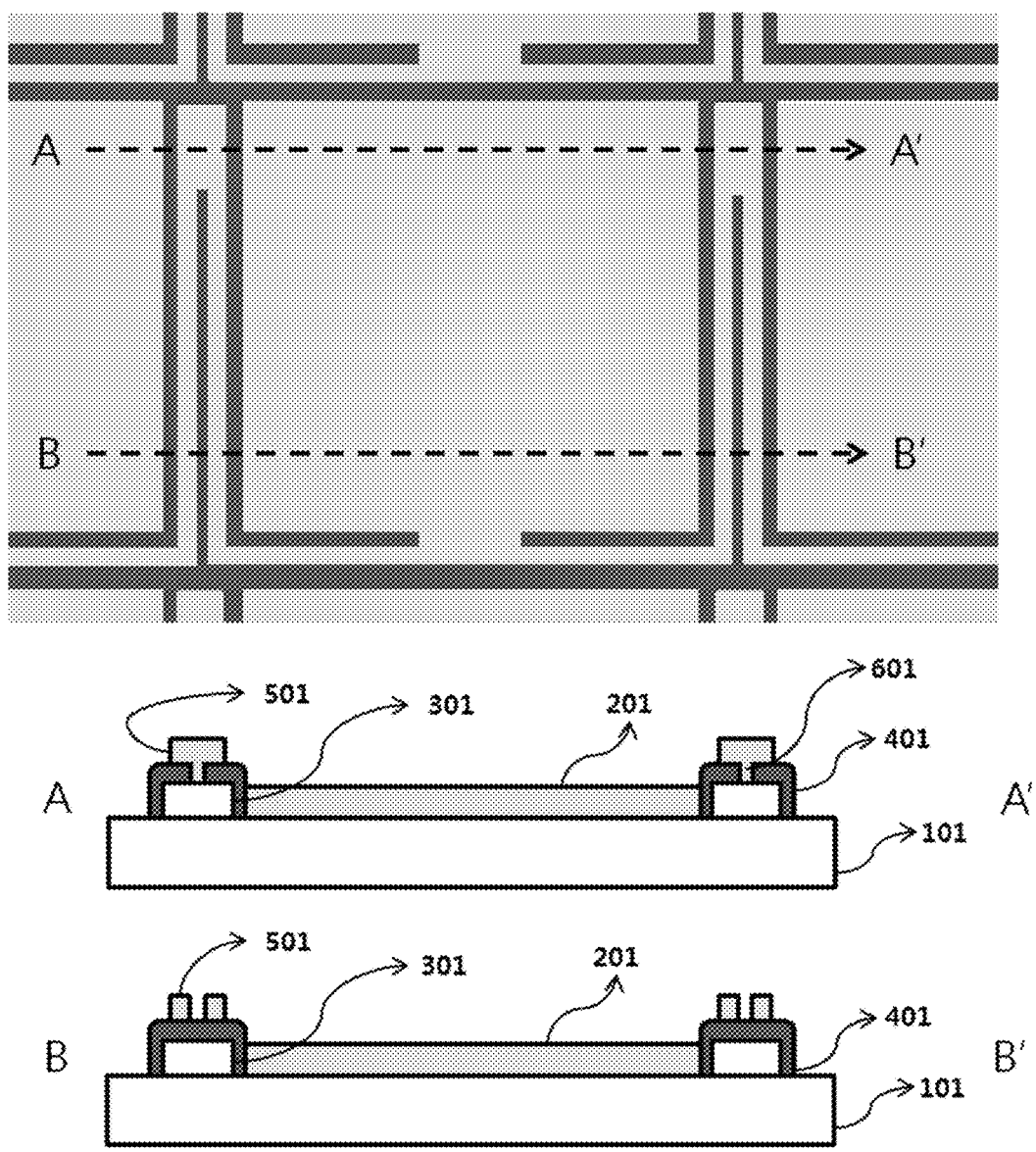
FIG. 1 shows a plane diagram and a sectional diagram disposing main constitutions of an organic light emitting device according to one embodiment of the present specification.

FIG. 1 shows a plane diagram and a sectional diagram disposing main constitutions of the organic light emitting device according to one embodiment of the present specification. Specifically, FIG. 1 illustrates one example of the constitutions of a substrate, a first electrode, an auxiliary electrode and an insulation layer.

Dark regions of FIG. 1 are regions in which a first electrode (201, 501) is not formed, and represent an insulation layer (401). In the sectional diagram of FIG. 1, an auxiliary electrode (301) is provided on a substrate (101), and the insulation layer (401) covers the auxiliary electrode (301). Moreover, contact holes (601) are formed in some regions of the insulation layer (401), and provide a path capable of connecting the auxiliary electrode (301) and the conductive connection (501).

According to one embodiment of the present specification, after the first electrode is formed on a substrate, an insulation layer is formed on the conductive connection, and an auxiliary electrode may be provided on the insulation layer.

Figure 2:
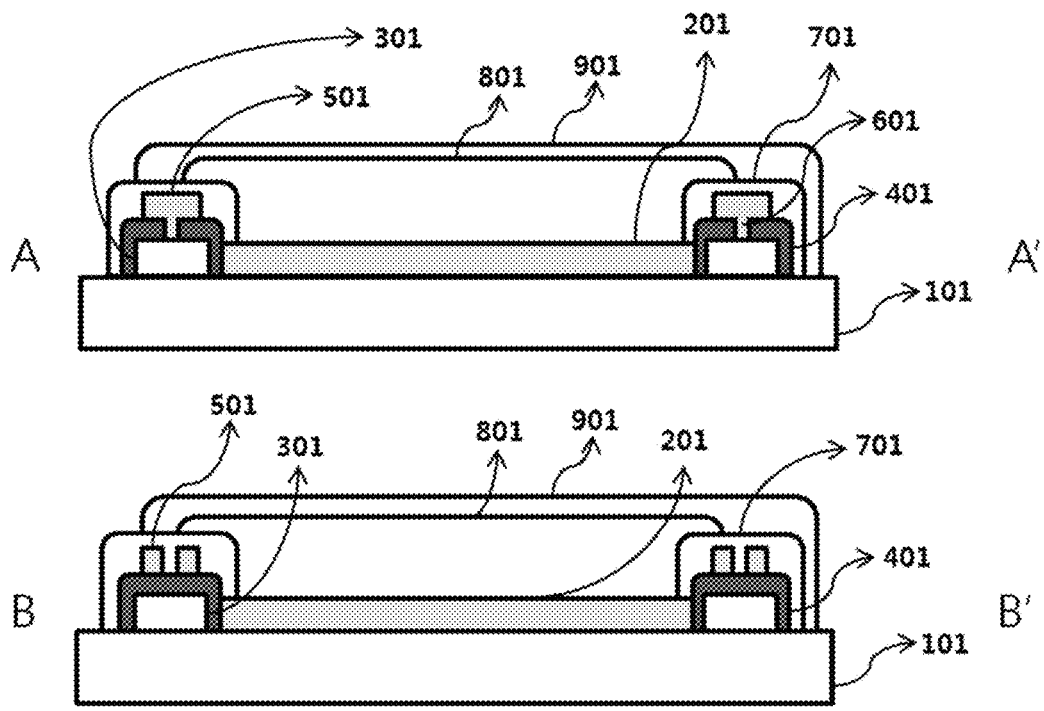
FIG. 2 shows a sectional diagram of an organic light emitting device according to one embodiment of the present specification.

FIG. 2 illustrates one example of the organic light emitting device further including, in the constitution of the sectional diagram of FIG. 1, an organic material layer (801) and a second electrode (901) consecutively provided on the conductive unit (201). According to one embodiment of the present specification, the organic light emitting device may be sealed with an encapsulation layer in the constitution of FIG. 2.

Figure 3:
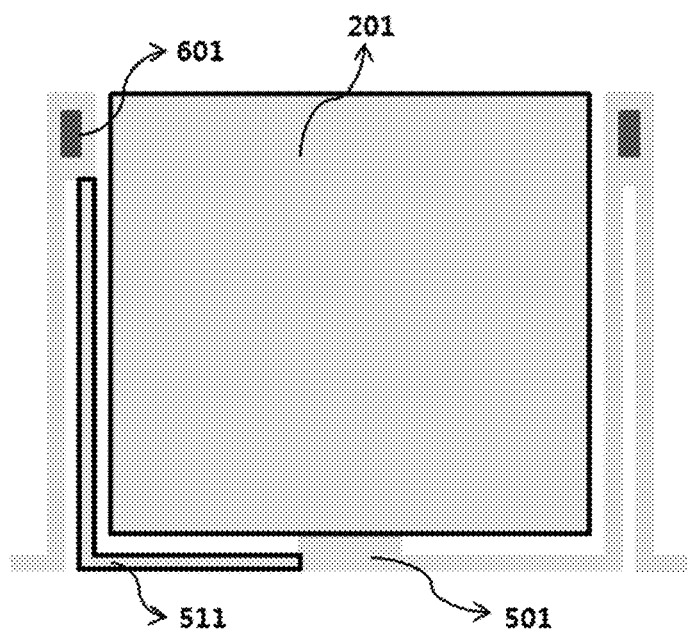
FIG. 3 shows any one conductive unit of a first electrode of an organic light emitting device according to one embodiment of the present specification.
Figure 4:
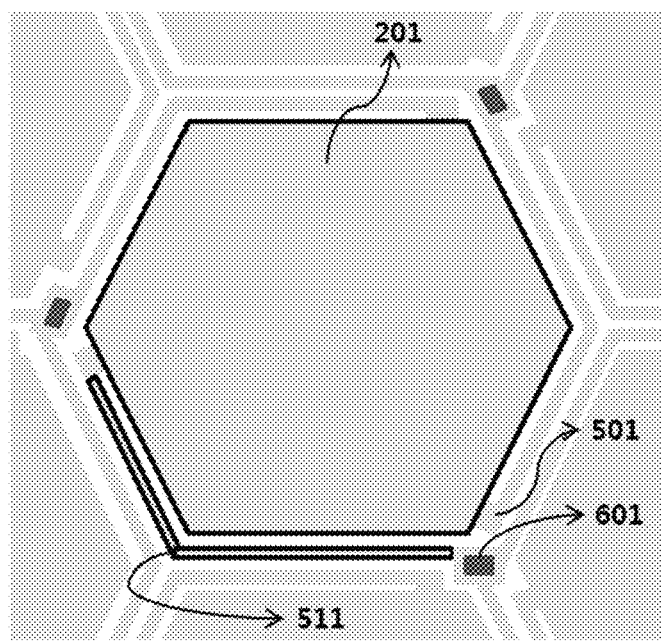
FIG. 4 shows any one conductive unit of a first electrode of an organic light emitting device according to one embodiment of the present specification.

FIG. 3 and FIG. 4 show any one conductive unit of a first electrode of the organic light emitting device according to one embodiment of the present specification. In FIG. 3 and FIG. 4, a conductive unit (201) is formed adjoining a conductive connection (501), the conductive connection (501) includes two high resistance regions (511), and the conductive connection (501) may be electrically connected to an auxiliary electrode through contact holes (601).

According to one embodiment of the present specification, the conductive unit may be included in a light emitting region of the organic light emitting device. Specifically, according to one embodiment of the present specification, the light emitting region may include each pixel region of the organic light emitting device, and at least one region of each of the conductive units may be located in the light emitting region of the organic light emitting device. More specifically, according to one embodiment of the present specification, a light emission phenomenon occurs in an organic material layer including a light emitting layer formed on a region forming the conductive unit, and light may emit through the conductive unit.

The light emitting region in the present specification means a region in which light emitting at a light emitting layer of an organic material layer emits through a first electrode and/or a second electrode. For example, in the organic light emitting device according to one embodiment of the present specification, the light emitting region may be formed in at least some of the first electrode region in which an auxiliary electrode is not formed among the regions in which the first electrode is formed on a substrate. In addition, a non-light emitting region in the present specification may mean the remaining regions excluding the light emitting region. According to one embodiment of the present specification, the non-light emitting region of the organic light emitting device may mean a region in which an auxiliary electrode is formed.

Short defects may occur when a second electrode is directly in contact with a first electrode. Alternatively, short defects may also occur when an organic material layer loses the function due to a thickness decrease, deformation or the like of the organic material layer located between a first electrode and a second electrode, and the first electrode is in contact with the second electrode. When short defects occur, a low path is provided to the current of an organic light emitting device, and the organic light emitting device may not normally operate. Due to a leakage current in which a current directly flows from a first electrode to a second electrode due to short defects, the current of an organic light emitting device may flow avoiding a defectless area. This may decrease light emission output of the organic light emitting device, and in many cases, the organic light emitting device may not operate. In addition, when a current used to dispersively flow to a large area of organic materials flows intensively to a short circuit occurring location, high heat is generated locally causing a risk of device breakage or fire.

However, in the organic light emitting device according to one embodiment of the present specification, all operating currents flowing to a short defect region may be prevented by the conductive connection even when short defects occur in any one or more of the conductive units. In other words, the conductive connection includes a high resistance region, thereby is capable of controlling the quantity of a leakage current so that it does not increase infinitely. Accordingly, in the organic light emitting device of the present specification, the remaining conductive units having no short defects may normally operate even when short defects occur in some of the conductive units.

Specifically, the conductive connection performs a role of preventing a current escaping through a short defect region by applying moderate resistance when short defects occur by a high resistance region that has a high resistance value. For this, the resistance value of the high resistance region may be determined considering leakage current control due to short defects, and a driving voltage increase generated due to the high resistance region when no short defects occur.

According to one embodiment of the present specification, the conductive units may be electrically parallel connected.

According to one embodiment of the present specification, the conductive connection may electrically connect the auxiliary electrode and the conductive unit.

According to one embodiment of the present specification, the conductive connection may physically connect the conductive units to each other.

Specifically, in the organic light emitting device, a current may flow from the auxiliary electrode to the conductive unit through the conductive connection including a high resistance region. More specifically, when a voltage is applied to the organic light emitting device through external power, a current flow of any one conductive unit may be in a direction of an auxiliary electrode→a conductive connection→a conductive unit→an organic material layer→a second electrode, or a direction reverse thereto.

Each of the conductive units of the present specification is separated from each other, and a current may be supplied to each of the conductive units from the auxiliary electrode through the conductive connection. This is for preventing the whole organic light emitting device not operating, when a short circuit occurs in any one conductive unit, by a current having to flow to another unit not experiencing a short circuit flows to the conductive unit experiencing a short circuit.

The any one or more conductive units may be included in one pixel of the organic light emitting device. Specifically, the conductive unit may perform a role of a transparent electrode of each pixel.

According to one embodiment of the present specification, the conductive connection may include one or more, or two or more high resistance regions.

When a narrow high resistance region is formed, disconnection possibly occurs during a process. When a high resistance region is disconnected, a conductive unit experiencing no short circuit is not electrified, and a conductive unit connected to the disconnected high resistance region may not operate.

Accordingly, in the organic light emitting device according to one embodiment of the present specification, each of the conductive connections has two or more high resistance regions, and therefore, there is an advantage in that, even when any one high resistance region of the conductive connection connected to each conductive unit is disconnected, the conductive unit may normally operate by the remaining high resistance regions.

According to one embodiment of the present specification, each of the conductive units may be electrically connected to an auxiliary electrode by a high resistance region having the lowest resistance value among the two or more high resistance regions that are not disconnected.

According to one embodiment of the present specification, at least a part of the conductive connection may be provided on a non-light emitting region provided with the auxiliary electrode. Specifically, the high resistance region may be provided on a non-light emitting region provided with the auxiliary electrode. Accordingly, in the plane diagram of the organic light emitting device, a decrease in an aperture ratio due to the high resistance region may be minimized by the high resistance region being located on a region in which the auxiliary electrode is formed.

The conductive connection of the present specification may be an end portion of the conductive unit, and the shape or the location is not particularly limited. In addition, the conductive connection may have a form projected in the middle of one vertex, one edge or one side of a conductive unit having a polygonal shape including a quadrangle.

According to one embodiment of the present specification, the conductive connection may include a high resistance region in which a length of a current flowing direction is longer than a width of a direction vertical thereto. Specifically, according to one embodiment of the present specification, the high resistance region may include a region in which a ratio of the length and the width is 10:1 or greater.

The conductive connection of the present specification may have relatively higher resistance compared to the conductive unit. Moreover, the conductive connection of the present specification may perform a short circuit preventing function in the organic light emitting device. In other words, when short defects occur in an organic light emitting device, the conductive connection of the present specification performs a role of enabling the operation of the device despite the short defects.

According to one embodiment of the present specification, a material of the conductive connection may be the same as a material of the conductive unit. Specifically, the conductive connection and the conductive unit are included in the first electrode, and may be formed with the same material.

The length and the width of the present specification is a relative concept, and the length may mean a spatial distance from one end to the other end of the conductive connection when seen from the top. In other words, even when the conductive connection is a combination of straight lines or includes curves, the length may mean a value measuring the length assuming a straight line. The width in the present specification may mean a distance from the center of the length direction to both ends of the vertical direction of the conductive connection when seen from the top. One example of the length and the width is illustrated in FIG. 5.

The length of the present specification may mean a measurement of a current flowing direction. In addition, the width of the present specification may mean a measurement of a direction vertical to the current flowing direction.

In addition, the length of the present specification may mean a distance that a current migrates from the auxiliary electrode to the conductive unit, and the width may mean a distance vertical to the length direction.

Figure 5:
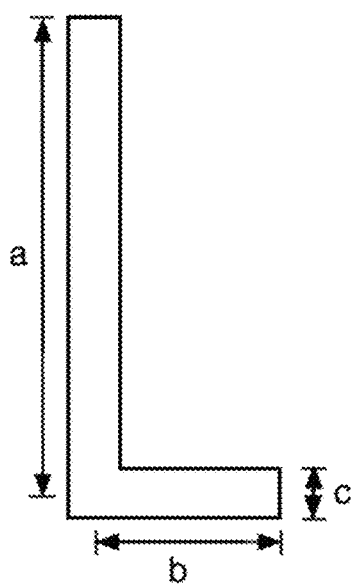
FIG. 5 illustrates one example of a length and a width in a high resistance region of a conductive connection of the present specification.

In FIG. 5, the distance may be a sum of a and b, and the width may be c.

According to one embodiment of the present specification, the conductive connection may physically adjoin the auxiliary electrode through the contact holes. Specifically, the contact holes (601) area in FIG. 3 and FIG. 4 is filled with a conductive connection (501), and adjoins a lower auxiliary electrode and the conductive connection (501).

According to one embodiment of the present specification, the insulation layer may insulate a surface excluding a surface of the auxiliary electrode or the first electrode adjoining the substrate, or a region in which the auxiliary electrode or the first electrode adjoins the contact holes.

Specifically, the insulation layer is provided covering an exposed surface of the conductive connection or the auxiliary electrode provided on a substrate, and may provide contact holes through which the conductive connection and the auxiliary electrode are exposed to the outside by removing at least one region of the insulation layer. The contact holes may become a path electrically connecting the conductive connection and the auxiliary electrode. Specifically, the contact holes may be a region capable of physically connecting the auxiliary electrode to the first electrode.

The contact holes of the present specification may become means for preventing a decrease in the aperture ratio of the organic light emitting device by the conductive connection, and the contact holes may be provided on an upper surface or lower surface of the auxiliary electrode. Specifically, the contact holes may be located in a non-light emitting region in which the auxiliary electrode is formed. Moreover, in order to prevent a decrease in the aperture ratio of the organic light emitting device due to the contact holes, a maximum diameter of the contact holes may not be greater than a line width of the auxiliary electrode.

According to one embodiment of the present specification, an additional insulation layer insulating the conductive connection and the organic material layer may be further provided in the organic light emitting device. Specifically, after forming the auxiliary electrode and the first electrode, an additional insulation layer may be provided on the first electrode and/or the auxiliary electrode excluding a region provided with the conductive unit. This is for insulating the organic material layer provided on the first electrode and/or the auxiliary electrode, and the conductive connection.

According to one embodiment of the present specification, the insulation layer and the additional insulation layer may each be an organic insulation layer or an inorganic insulation layer. Materials of the insulation layer and the additional insulation layer are not limited as along as the materials are generally used in the art.

According to one embodiment of the present specification, resistance from the auxiliary electrode to the conductive unit may be greater than or equal to 1 kΩ and less than or equal to 1 MΩ.

The any one conductive unit and adjacent another conductive unit may mean any one conductive unit and physically closest another conductive unit.

According to one embodiment of the present specification, the first electrode may include 1,000 or more of the conductive units separated from each other. Specifically, the first electrode may include greater than or equal to 1,000 and less than or equal to 1,000,000 of the conductive units separated from each other.

In addition, according to one embodiment of the present specification, the first electrode may be formed with patterns of two or more of the conductive units. Specifically, the conductive unit may be formed with patterns in which regions excluding the conductive connection are separated from each other.

The pattern of the present specification may have the shape of a closed figure. Specifically, the pattern may be a polygon such as a triangle, a quadrangle and a hexagon, or may be an amorphous form.

Figure 6:
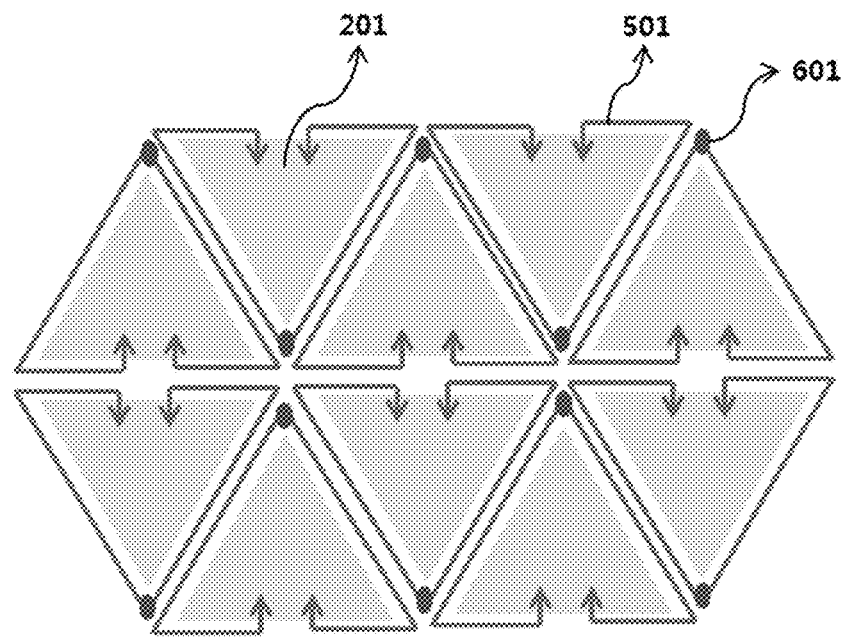
FIG. 6 to FIG. 11 show the shapes of a first electrode in an organic light emitting device according to one embodiment of the present specification.
Figure 7:
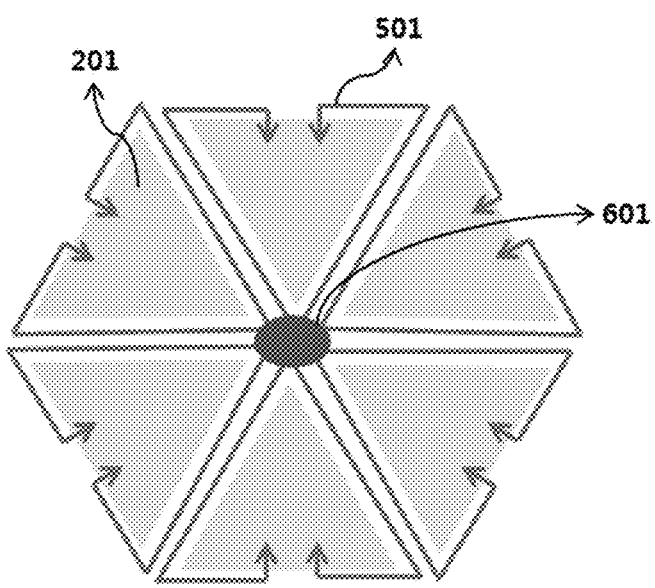
Figure 8:
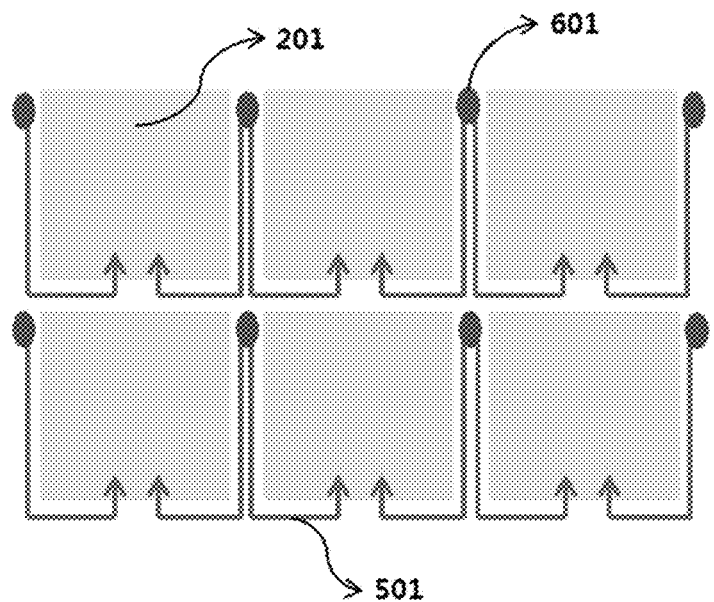
Figure 9:
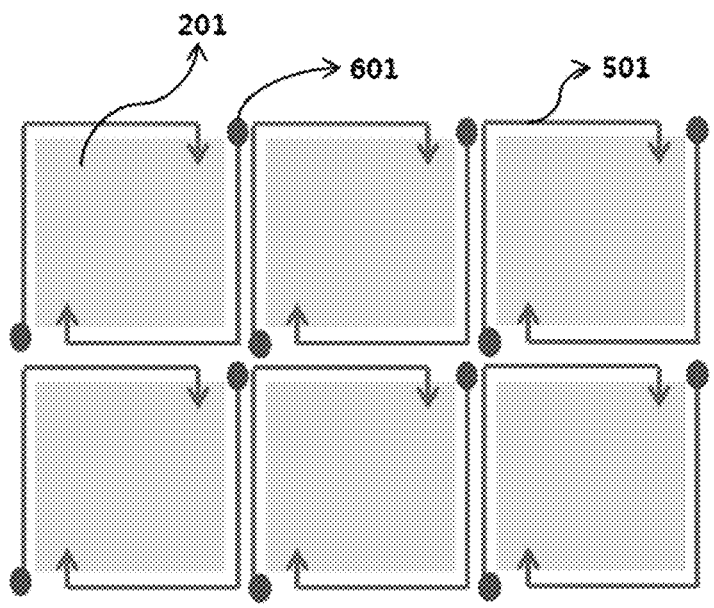
Figure 10:
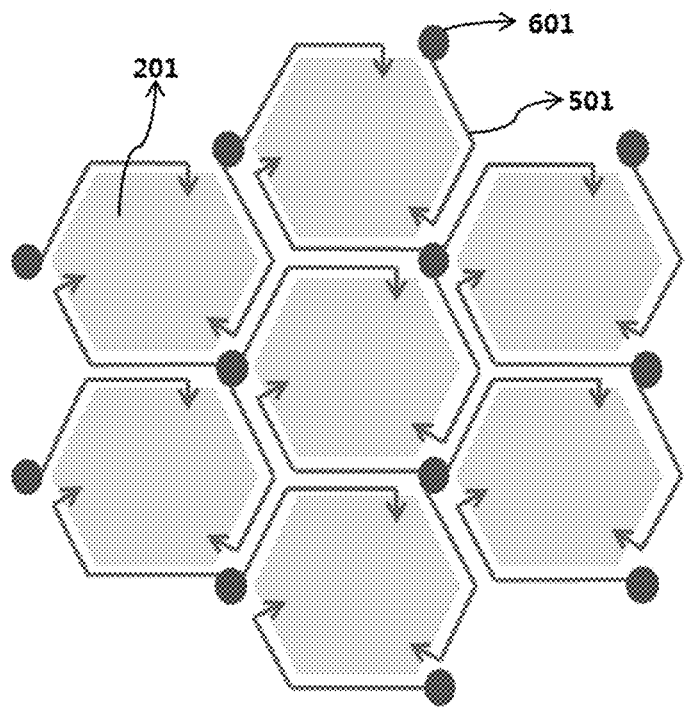
Figure 11:
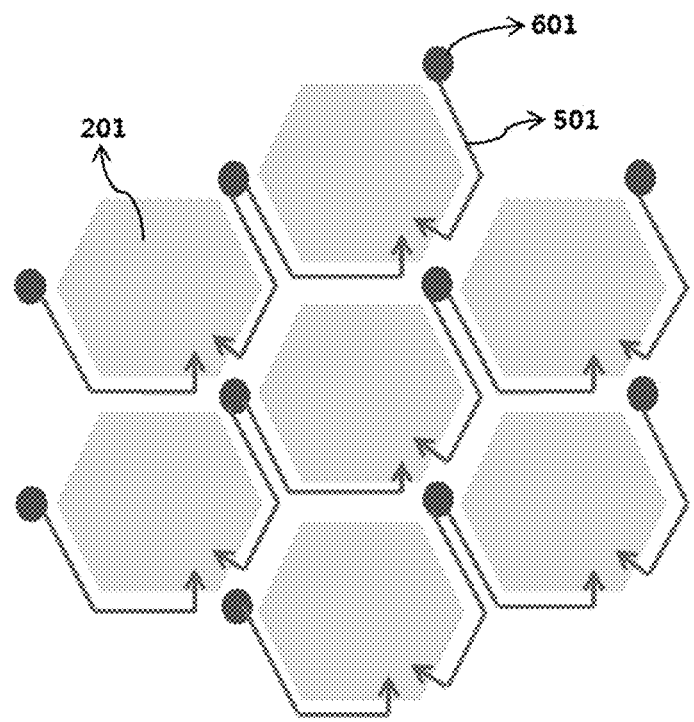

FIG. 6 to FIG. 11 show the shapes of a first electrode in the organic light emitting device according to one embodiment of the present specification. Specifically, FIG. 6 and FIG. 7 show cases of the conductive unit (201) forming a triangular pattern. FIG. 8 and FIG. 9 show cases of the conductive unit (201) forming a quadrangular pattern. FIG. 10 and FIG. 11 show cases of the conductive unit (201) forming a hexagonal pattern. In FIG. 6 to FIG. 11, those represented as circles or ellipses mean contact holes (601) being provided, and those represented as arrows show a conductive connection (501), and the direction of the arrows shows a direction of a current flowing to the conductive unit (201) through the conductive connection (501).

According to one embodiment of the present specification, the shape of the first electrode of the organic light emitting device is not limited to those in FIG. 6 to FIG. 11, and various shapes may be provided. In addition, according to one embodiment of the present specification, the number of the contact holes of the organic light emitting device and the disposition of the conductive connection and the like are not limited to those in FIG. 6 to FIG. 11, and various shapes may be provided.

When the number of the conductive units of the present specification is 1,000 or greater, an effect of the organic light emitting device minimizing a leakage current quantity during the occurrence of a short circuit while minimizing a voltage increase during normal operation may be obtained. In addition, as the number of the conductive units of the present specification increases up to 1,000,000 or less, the effect may be maintained while maintaining an aperture ratio. In other words, when the number of the conductive units is greater than 1,000,000, a decrease in the aperture ratio may occur due to the increase in the number of auxiliary electrodes.

According to one embodiment of the present specification, the area the conductive units occupy in the organic light emitting device may be greater than or equal to 50% and less than or equal to 90% based on the plane diagram of the whole organic light emitting device. Specifically, the conductive unit is included in a light emitting region, and the area the conductive units occupy may be the same as or similar to an aperture ratio of the organic light emitting device based on the light emitting surface of the whole organic light emitting device.

In the first electrode of the present specification, each of the conductive units is electrically connected by the conductive connection, and therefore, a driving voltage of a device increases. Therefore, according to one embodiment of the present specification, the first electrode may have a short circuit preventing function by the conductive connection while lowering a driving voltage of the device by including 1,000 or more of the conductive units in order to complement a driving voltage increase by the conductive connection.

According to one embodiment of the present specification, an area of each of the conductive units may be greater than or equal to 0.01 mm$^2$ and less than or equal to 25 mm$^2$.

When an area of each of the conductive units is made to be small, there is an advantage in that both an operating voltage increase rate due to the conductive connection introduced for preventing a short circuit, and a leakage current value with respect to an operating current are lowered. In addition, there is an advantage in that product quality decline may be minimized by minimizing a non-light emitting region when a conductive unit in which light does not emit due to a short circuit is generated. However, when an area of the conductive unit is made to be too small, a ratio of the light emitting region in the whole device region greatly decreases leading to a problem of an organic light emitting device efficiency decrease caused by an aperture ratio decrease. Accordingly, when an organic light emitting device is manufactured with the area of the conductive unit described above, the advantages described above may be maximally exhibited while minimizing the disadvantages described above.

In the organic light emitting device according to one embodiment of the present specification, the conductive connection, the conductive unit, and an organic material layer including a light emitting layer may be electrically series connected to each other. The light emitting layer of the present specification is located between the first electrode and the second electrode, and the two or more light emitting layers may be electrically parallel connected to each other.

According to one embodiment of the present specification, the light emitting layer is located between the conductive unit and the second electrode, and each of the light emitting layers may be electrically parallel connected to each other. In other words, the light emitting layer of the present specification may be located corresponding to a region corresponding to the conductive unit.

When the light emitting layer of the present specification operates at the same current density, a resistance value increases as the area of the light emitting layer decreases. According to one embodiment of the present specification, when the area of each of the conductive units becomes smaller and the number increases, the area of each of the light emitting layers also becomes smaller. In this case, the ratio of the voltage of the conductive connection series connected to the organic material layer decreases compared to the voltage applied to the organic material layer including the light emitting layer when the organic light emitting device operates.

When a short circuit occurs in the organic light emitting device of the present specification, the leakage current quantity may be determined by a resistance value and an operating voltage from the auxiliary electrode to the conductive unit regardless of the number of the conductive units. Accordingly, a voltage increase phenomenon by the conductive connection during normal operation may be minimized when increasing the number of the conductive units, and the leakage current quantity may also be minimized when a short circuit occurs.

According to one embodiment of the present specification, the auxiliary electrode may have sheet resistance of 3Ω/□ or less. Specifically, the auxiliary electrode may have sheet resistance of 1Ω/□ or less.

When sheet resistance of any one of a first electrode and a second electrode having a large area is higher than is needed, voltages may be different for each location of the electrode. As a result, when a potential difference between the first electrode and the second electrode placing an organic material layer in between becomes different, brightness uniformity of an organic light emitting device may decrease. Accordingly, in order to lower the sheet resistance of the first electrode or the second electrode having higher sheet resistance than is needed, an auxiliary electrode may be used. The sheet resistance of the auxiliary electrode of the present specification may be 3Ω/□ or less, and specifically 1Ω/□ or less, and in the above-mentioned range, the organic light emitting device may maintain high brightness uniformity.

According to one embodiment of the present specification, the first electrode may be formed as a transparent electrode. In this case, sheet resistance of the first electrode may be higher than sheet resistance required for the operation of the organic light emitting device. Accordingly, in order to lower the sheet resistance of the first electrode, the sheet resistance of the first electrode may be lowered to the sheet resistance level of the auxiliary electrode by electrically connecting the auxiliary electrode to the first electrode.

According to one embodiment of the present specification, the auxiliary electrode may be formed with conductive lines electrically connected to each other. Specifically, the conductive lines may be formed with conductive patterns. Specifically, the whole auxiliary electrode may be driven by applying a voltage to at least one region of the auxiliary electrode of the present specification.

According to one embodiment of the present specification, the organic light emitting device may be used as being included in OLED illumination. In the case of the OLED illumination, light emission with uniform brightness in the whole light emitting region, that is, in all the organic light emitting devices, is important. Specifically, in order to accomplish uniform brightness in the OLED illumination, voltages formed between the first electrode and the second electrode of all the organic light emitting devices included in the OLED illumination are preferably maintained to be the same.

In the organic light emitting device according to one embodiment of the present specification, when the first electrode is a transparent electrode, and the second electrode is a metal electrode, the second electrode of each organic light emitting device has sufficiently low sheet resistance, and there is almost no voltage difference in the second electrode of each of the organic light emitting devices, however, in the case of the first electrode, a voltage difference may exist in each of the organic light emitting devices. According to one embodiment of the present specification, the auxiliary electrode, and specifically, a metal auxiliary electrode, may be used in order to complement the first electrode voltage difference of each of the organic light emitting devices.

According to one embodiment of the present specification, the metal auxiliary electrode may be formed with conductive lines electrically connected to each other. Specifically, the auxiliary electrode is capable of allowing almost no voltage difference in the first electrode of each organic light emitting device by forming conductive lines.

According to one embodiment of the present specification, the conductive unit may have sheet resistance of $1\Omega/\square$ or greater, or $3\Omega/\square$ or greater, and specifically, may be $10\Omega/\square$ or greater. In addition, the conductive unit may have sheet resistance of $1,000\Omega/\square$ or less, or $500\Omega/\square$ or less. In other words, according to one embodiment of the present specification, the conductive unit may have sheet resistance of greater than or equal to $1\Omega/\square$ and less than or equal to $1,000\Omega/\square$, or greater than or equal to $10\Omega/\square$ and less than or equal to $500\ \Omega/\square$.

According to one embodiment of the present specification, the sheet resistance level required for the conductive unit may be controlled so as to be inversely proportional to an area of the conductive unit corresponding to a light emitting area. For example, when the conductive unit has a light emitting area of $100\ cm^2$, the sheet resistance required for the conductive unit may be approximately $1\Omega/\square$. Moreover, when each of the conductive units is formed to be small, the sheet resistance required for the conductive unit may be $1\Omega/\square$ or greater.

According to one embodiment of the present specification, when the first electrode is formed as a transparent electrode such as ITO, an auxiliary electrode may be used so that the sheet resistance of the conductive unit satisfies $1\Omega/\square$ or greater. Specifically, the auxiliary electrode may be a metal auxiliary electrode.

The sheet resistance of the conductive unit of the present specification may be determined by materials forming the conductive unit, and may also be lowered to a sheet resistance level of an auxiliary electrode by being electrically connected to the auxiliary electrode. Accordingly, the sheet resistance value of the conductive unit required in the organic light emitting device of the present specification may be adjusted by the materials of the auxiliary electrode and the conductive unit.

According to one embodiment of the present specification, the auxiliary electrode may be formed as a stripe structure or mesh structure. When the auxiliary electrode is formed as a mesh structure, the conductive unit may be provided in empty space of the mesh.

According to one embodiment of the present specification, the auxiliary electrode may have a line width of greater or equal to 1 μm and less than or equal to 100 μm.

The line width of the auxiliary electrode may mean a line thickness of the auxiliary electrode based on the parallel section of a substrate surface provided with the auxiliary electrode. In addition, the line width of the auxiliary electrode may mean the thickest line thickness of the auxiliary electrode based on the parallel section of a substrate surface provided with the auxiliary electrode.

When the auxiliary electrode is formed to have the line width in the above-mentioned range, efficiency of the organic light emitting device may increase by securing an aperture ratio.

According to one embodiment of the present specification, the auxiliary electrode may be provided as a mesh structure surrounding one or more of the conductive units.

According to one embodiment of the present specification, the auxiliary electrode may be provided as a mesh structure forming repeated pattern units of a triangle, a quadrangle or a hexagon. Specifically, the mesh structure may form an aperture region having a repeated shape of a triangle, a quadrangle, a hexagon or the like.

The pattern unit may mean a repeated closed region formed by the auxiliary electrode.

According to one embodiment of the present specification, the auxiliary electrode may have an aperture ratio of 60% or greater. Specifically, the auxiliary electrode may have an aperture ratio of 70%, or 80% or greater.

According to one embodiment of the present specification, the organic light emitting device may have an aperture ratio of 60% or greater based on the light emitting surface.

According to one embodiment of the present specification, the high resistance region may have a line width of greater than or equal to 0.5 μm and less than or equal to 100 μm. As described above, in the organic light emitting device, the high resistance region may be located on a region provided with the auxiliary electrode in order to secure an aperture ratio. Accordingly, the high resistance region may have the same as or smaller than a line width of the auxiliary electrode.

According to one embodiment of the present specification, the first electrode may be a transparent electrode.

When the first electrode is a transparent electrode, the first electrode may be a conductive oxide such as indium tin oxide (ITO) or indium zinc oxide (IZO). Moreover, the first electrode may be a semi-transparent electrode. When the first electrode is a semi-transparent electrode, the first electrode may be prepared with a semi-transparent metal such as Ag, Au, Mg, Ca or alloys thereof. When a semi-transparent metal is used as the first electrode, the organic light emitting device may have a microcavity structure.

According to one embodiment of the present specification, the auxiliary electrode may be formed with metal materials. In other words, the auxiliary electrode may be a metal electrode.

The auxiliary electrode may generally use all metals. Specifically, aluminum, copper and/or silver having favorable conductivity may be included. When the auxiliary electrode uses aluminum for adhesion with a transparent electrode or stability in a photo process, a molybdenum/aluminum/molybdenum layer may also be used.

According to one embodiment of the present specification, the organic material layer includes at least one or more light emitting layers, and may further include one, two or more types selected from the group consisting of a hole injection layer; a hole transfer layer; a hole blocking layer; a charge generating layer; an electron blocking layer; an electron transfer layer; and an electron injection layer.

The charge generating layer means a layer generating holes and electrons when a voltage is applied.

As the substrate, a substrate having excellent transparency, surface smoothness, handling easiness and water resistance may be used. Specifically, a glass substrate, a thin glass substrate or a transparent plastic substrate may be used. The plastic substrate may include a film such as polyethylene terephthalate (PET), polyethylene naphthalate (PEN), polyether ether ketone (PEEK) and polyimide (PI) in the form of a single layer or multilayer. In addition, the substrate may include a light scattering function in the substrate itself. However, the substrate is not limited thereto, and substrates commonly used in organic light emitting devices may be used.

According to one embodiment of the present specification, the first electrode may be an anode, and the second electrode may be a cathode. In addition, the first electrode may be a cathode, and the second electrode may be an anode.

As the anode, a material having large work function is normally preferable so that hole injection to the organic material layer is smooth. Specific examples of the anode material capable of being used in the present invention include metals such as vanadium, chromium, copper, zinc and gold, or alloys thereof; metal oxides such as zinc oxides, indium oxides, indium tin oxides (ITO) and indium zinc oxide (IZO); combinations of metals and oxides such as ZnO:Al or $SnO_2$:Sb; conductive polymers such as poly(3-methylthiophene), poly[3,4-(ethylen-1,2-dioxy)thiophene] (PEDOT), polypyrrole and polyaniline, and the like, but are not limited thereto.

The materials of the anode are not limited to the anode, and may be used as a material of the cathode.

As the cathode, a material having small work function is normally preferable so that electron injection to the organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The materials of the cathode are not limited to the cathode, and may be used as a material of the anode.

As the hole transfer layer material according to the present specification, a material capable of receiving the holes from the anode or the hole injection layer, moving the holes to the light emitting layer, and having high mobility for the holes, is suitable. Specific examples thereof include an arylamin-based organic material, a conductive polymer, a block copolymer having conjugated parts and non-conjugated parts together, and the like, but are not limited thereto.

As the light emitting layer material according to the present specification, a material capable of emitting light in a visible region by receiving holes and electrons from the hole transfer layer and the electron transfer layer, respectively, and binding the holes and the electrons, and is preferably a material having favorable quantum efficiency for fluorescence or phosphorescence. Specific examples thereof include a 8-hydroxy-quinoline aluminum complex ($Alq_3$); a carbazole-based compound; a dimerized styryl compound; BAlq; a 10-hydroxybenzo quinolin-metal compound; a benzoxazole-, a benzthiazole- and a benzimidazole-based compound; a poly(p-phenylenevinylene) (PPV)-based polymer; a spiro compound; polyfluorene, rubrene, and the like, but are not limited thereto.

As the electron transfer layer material according to the present specification, a material capable of favorably receiving electrons from the cathode, moving the electrons to the light emitting layer, and having high mobility for the electrons, is suitable. Specific examples thereof include an Al complex of 8-hydroxyquinoline; a complex including $Alq_3$; an organic radical compound; a hydroxyflavon-metal complex and the like, but are not limited thereto.

According to one embodiment of the present specification, the auxiliary electrode may be located in a non-light emitting region of the organic light emitting device.

According to one embodiment of the present specification, the organic light emitting device may be sealed with an encapsulation layer.

The encapsulation layer may be formed with a transparent resin layer. The encapsulation layer performs a role of preventing the organic light emitting device from oxygen and contaminants, and may be a transparent material so as not to inhibit light emission of the organic light emitting device. The transparency may mean transmitting 60% or more of light, and specifically, transmitting 75% or more of light.

According to one embodiment of the present specification, the organic light emitting device may emit white light having a color temperature of greater than or equal to 2,000 K and less than or equal to 12,000 K.

According to one embodiment of the present specification, a light scattering layer may be further included between the substrate and the first electrode.

Specifically, according to one embodiment of the present specification, a substrate provided on a surface opposite to the surface provided with the organic material layer of the first electrode may be further included, and a light scattering layer provided between the substrate and the first electrode may be further included. According to one embodiment of the present specification, the light scattering layer may include a planarization layer. According to one embodiment of the present specification, the planarization layer may be provided between the first electrode and the light scattering layer.

Alternatively, according to one embodiment of the present specification, a light scattering layer may be further included on a surface opposite to the surface provided with the first electrode of the substrate.

According to one embodiment of the present specification, the light scattering layer induces light scattering, and the structure is not particularly limited as long as it has a structure capable of enhancing light scattering efficiency of the organic light emitting device. Specifically, according to one embodiment of the present specification, the light scattering layer may have a structure in which scattered particles are dispersed into a binder, a film having unevenness, and/or a film having hazeness.

According to one embodiment of the present specification, the light scattering layer may be directly formed on the substrate using a method such as spin coating, bar coating and slit coating, or may be formed using a method of being prepared in a film form and attached.

According to one embodiment of the present specification, the organic light emitting device may be a flexible organic light emitting device. In this case, the substrate may include a flexible material. Specifically, the substrate may be bendable thin-film-type glass, a plastic substrate or film-type substrate.

A material of the plastic substrate is not particularly limited, however, a film such as polyethylene terephthalate (PET), polyethylene naphthalate (PEN), polyether ether ketone (PEEK) and polyimide (PI) may be generally included in the form of a single layer or multilayer.

The present specification provides a display device including the organic light emitting device. The organic light emitting device may perform a role of a pixel or back light in the display device. As other constitutions of the display device, constitutions known in the art may be used.

The present specification provides an illumination device including the organic light emitting device. The organic light emitting device may perform a role of a light emitting unit in the illumination device. As other constitutions of the illumination device, constitutions known in the art may be used.

One embodiment of the present specification provides a method for manufacturing the organic light emitting device including preparing a substrate; forming an auxiliary electrode on the substrate; forming a first electrode including two or more conductive units provided to be separated from each other and a conductive connection connected to the conductive units on the substrate; forming an insulation layer including one or more contact holes on the conductive connection or the auxiliary electrode; forming one or more organic material layers on the first electrode; and forming a second electrode on the organic material layers, wherein the conductive connection is electrically connected to the auxiliary electrode through the contact holes, and the conductive connection includes one or more high resistance regions in which a length of a current flowing direction is longer than a width of a direction vertical thereto.

According to one embodiment of the present specification, the forming of an auxiliary electrode may use photo etching; deposition; or printing. Specifically, the forming of an auxiliary electrode may use a method for forming the auxiliary electrode as a stripe structure or mesh structure. As the photo etching, deposition and printing, methods generally used in the art may be used without limits.

According to one embodiment of the present specification, the forming of an insulation layer may be forming an insulation layer so as to cover the conductive connection or the auxiliary electrode, and then forming the contact holes by removing one region of the insulation layer.

According to one embodiment of the present specification, the forming of a first electrode may be forming a first electrode material layer on the substrate, and patterning the layer into the first electrode. Specifically, a first electrode material layer is formed on the substrate, and the first electrode material layer may be formed into the first electrode through photo etching, laser etching or the like. Moreover, after forming the first electrode on the substrate, an insulation layer may be formed the conductive connection, and an auxiliary electrode may be formed on the insulation layer.

According to one embodiment of the present specification, the forming of a first electrode may be forming, after the forming of an insulation layer, a first electrode material layer on the substrate on which the auxiliary electrode and the insulation layer are formed, and patterning the layer into the first electrode. Specifically, the forming of a first electrode may be forming, after the forming of an insulation layer, a first electrode material layer using a deposition process, and forming the first electrode material layer into the first electrode through photo etching, laser etching or the like.

The invention claimed is:

1. An organic light emitting device comprising:
   a substrate;
   a first electrode provided on the substrate, and including two or more conductive units provided to be separated from each other and a conductive connection connected to at least one of the two or more conductive units;
   an auxiliary electrode provided on the substrate, and disposed to be separated from the conductive units;
   an insulation layer provided on the conductive connection or the auxiliary electrode, and including one or more contact holes exposing one region of the conductive connection or the auxiliary electrode;
   a second insulation layer provided on the insulation layer and the conductive connection, a width of the second insulation layer wider than the insulation layer; and
   one or more organic material layers provided between the first electrode and a second electrode,
   wherein the conductive connection is electrically connected to the auxiliary electrode through the contact holes; and
   the conductive connection includes two or more high resistance regions in which a length of a current flowing direction is longer than a width of a direction perpendicular thereto,
   wherein the two or more high resistance regions of the conductive connection follow a contour of the auxiliary electrode.

2. The organic light emitting device of claim 1, wherein at least a part of the conductive connection is provided on a non-light emitting region provided with the auxiliary electrode.

3. The organic light emitting device of claim 1, wherein the high resistance region includes a region in which a ratio of the length and the width is 10:1 or greater.

4. The organic light emitting device of claim 1, wherein the conductive connection electrically connects the auxiliary electrode and the conductive unit.

5. The organic light emitting device of claim 1, wherein the conductive connection physically adjoins the auxiliary electrode through the contact holes.

6. The organic light emitting device of claim 1, wherein the insulation layer insulates a surface excluding a surface of the auxiliary electrode or the first electrode adjoining the substrate, or a region in which the auxiliary electrode or the first electrode adjoins the contact holes.

7. The organic light emitting device of claim 1, wherein the second insulation layer insulates the conductive connection and the organic material layer.

8. The organic light emitting device of claim 1, wherein resistance from the auxiliary electrode to the conductive unit is greater than or equal to 1 k$\Omega$ and less than or equal to 1 M$\Omega$.

9. The organic light emitting device of claim 1, wherein an area of each of the conductive units is greater than or equal to 0.01 mm$^2$ and less than or equal to 25 mm$^2$.

10. The organic light emitting device of claim 1, wherein the auxiliary electrode is provided as a mesh structure surrounding one or more of the conductive units.

11. The organic light emitting device of claim 1, wherein the auxiliary electrode is provided as a mesh structure forming repeated pattern units of a triangle, a quadrangle or a hexagon.

12. The organic light emitting device of claim 1, wherein the auxiliary electrode has a line width of greater than or equal to 1 µm and less than or equal to 100 µm.

13. The organic light emitting device of claim 1, wherein the high resistance region has a line width of greater than or equal to 0.5 µm and less than or equal to 100 µm.

14. The organic light emitting device of claim 1, wherein the conductive unit has sheet resistance of greater than or equal to 1$\Omega$/□ and less than or equal to 1,000$\Omega$/□.

15. The organic light emitting device of claim 1, wherein the auxiliary electrode has sheet resistance of 3$\Omega$/□ or less.

16. The organic light emitting device of claim 1, which is a flexible organic light emitting device.

17. A display device comprising the organic light emitting device of claim 1.

18. An illumination device comprising the organic light emitting device of claim 1.

19. A method for manufacturing an organic light emitting device comprising:
   preparing a substrate;
   forming an auxiliary electrode on the substrate;
   forming a first electrode including two or more conductive units provided to be separated from each other and a conductive connection connected to at least one of the two or more conductive units on the substrate;
   forming an insulation layer including one or more contact holes on the conductive connection or the auxiliary electrode;
   forming a second insulation layer on the insulation layer and the conductive connection, a width of the second insulation layer wider than the insulation layer;

forming one or more organic material layers on the first electrode; and forming a second electrode on the organic material layers, wherein the conductive connection is electrically connected to the auxiliary electrode through the contact holes; and the conductive connection includes two or more high resistance regions in which a length of a current flowing direction is longer than a width of a direction perpendicular thereto, wherein the two or more high resistance regions of the conductive connection follow a contour of the auxiliary electrode.

20. The method for manufacturing the organic light emitting device of claim 19, wherein the forming of an insulation layer is forming an insulation layer so as to cover the conductive connection or the auxiliary electrode, and then forming the contact holes by removing one region of the insulation layer.

21. The method for manufacturing the organic light emitting device of claim 19, wherein the forming of a first electrode is forming a first electrode material layer on the substrate, and patterning the layer into the first electrode.

22. The method for manufacturing the organic light emitting device of claim 19, wherein the forming of a first electrode is forming, after the forming of an insulation layer, a first electrode material layer on the substrate on which the auxiliary electrode and the insulation layer are formed, and patterning the layer into the first electrode.

* * * * *